(12) United States Patent
Gupta et al.

(10) Patent No.: US 7,164,305 B2
(45) Date of Patent: Jan. 16, 2007

(54) HIGH-VOLTAGE TOLERANT INPUT BUFFER CIRCUIT

(75) Inventors: Sushil Kumar Gupta, Noida (IN); Paras Garg, Ghaziabad (IN)

(73) Assignee: STMicroelectronics PVT. Ltd., Noida (IN)

( * ) Notice: Subject to any disclaimer, the term of this patent is extended or adjusted under 35 U.S.C. 154(b) by 45 days.

(21) Appl. No.: 11/146,912

(22) Filed: Jun. 7, 2005

(65) Prior Publication Data

US 2005/0286333 A1 Dec. 29, 2005

(30) Foreign Application Priority Data

Jun. 8, 2004 (IN) .................... 1060/DEL/2004

(51) Int. Cl.
*H03L 5/00* (2006.01)
(52) U.S. Cl. .................. 327/333; 327/108; 327/112; 326/81
(58) Field of Classification Search ............... 327/333; 326/68, 81
See application file for complete search history.

(56) References Cited

U.S. PATENT DOCUMENTS

| 5,933,027 | A | * | 8/1999 | Morris et al. | 326/81 |
|---|---|---|---|---|---|
| 5,952,848 | A | | 9/1999 | Morris | 326/81 |
| 6,236,236 | B1 | | 5/2001 | Chen | 326/81 |
| 6,346,829 | B1 | * | 2/2002 | Coddington | 326/81 |
| 6,784,717 | B1 | * | 8/2004 | Hunt et al. | 327/333 |
| 2005/0024101 | A1 | * | 2/2005 | Reed et al. | 327/108 |

* cited by examiner

*Primary Examiner*—Long Nguyen
(74) *Attorney, Agent, or Firm*—Hogan & Hartson LLP

(57) ABSTRACT

The present invention provides a high-voltage tolerant input buffer circuit including a first NMOS transistor having its source terminal connected to the input pin, its gate terminal connected to a first reference voltage and its drain terminal connected to a first output terminal; a second NMOS transistor having its gate terminal connected to said first reference voltage and its source terminal connected to said first output terminal; a first PMOS transistor having its gate terminal connected to the drain terminal of said second NMOS transistor, its drain terminal connected to a second reference voltage lower than said first reference voltage and its source terminal connected to a second output terminal; a second PMOS transistor having its drain terminal connected to the drain terminal of said second NMOS transistor, its source terminal connected to said second output terminal, and its gate terminal connected to a control voltage; and a third PMOS transistor having its drain terminal connected to said second output terminal, its source terminal connected to a supply voltage, and its gate terminal connected to said control voltage.

8 Claims, 6 Drawing Sheets

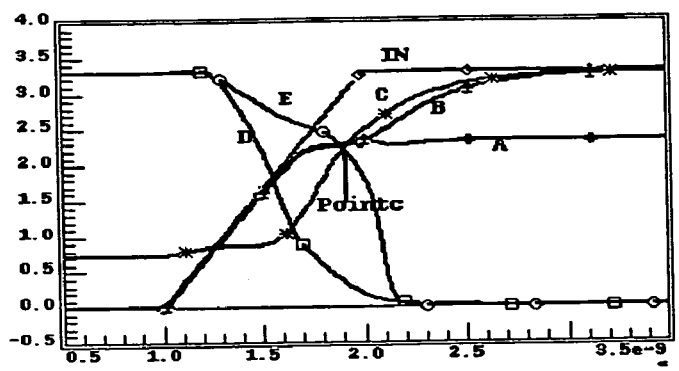
FIG 8. Internal node waveforms for low to high transition at IN.
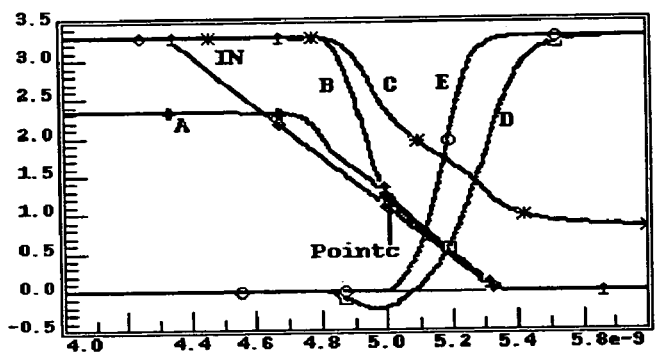
FIG 9. Internal node waveforms for high to low transition at IN
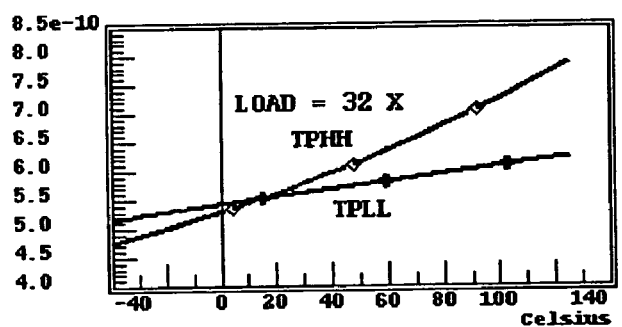
FIG 10. Delay plot for Schmitt-buffer at nominal case.
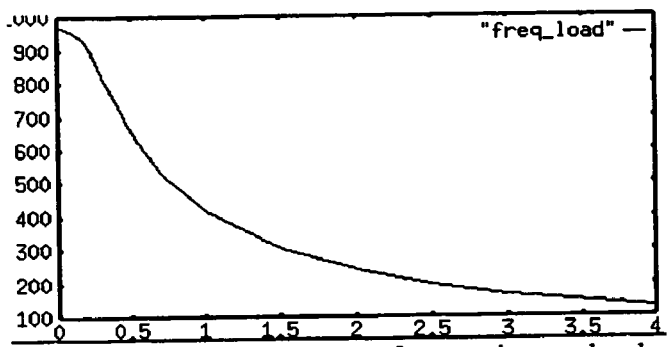
FIG 11. Max frequency of operation vs load plot.

HIGH-VOLTAGE TOLERANT INPUT BUFFER CIRCUIT

RELATED APPLICATION

The present invention claims priority of India Patent Application No. 1060/Del/2004, filed Jun. 8, 2004, which is incorporated herein in its entirety by this reference.

FIELD OF THE INVENTION

The present invention relates to an input buffer in the field of integrated circuits. Specifically, the invention pertains to a high-voltage tolerant input buffer circuit.

BACKGROUND OF THE INVENTION

With the advent of sub-micron technology, the device dimensions are decreased so as to be suitable in low cost and low power applications. Also, circuit designing for standard protocols has become more challenging. Sub-micron technology devices cannot tolerate high-voltage because of reliability issues. The gate-oxide breakdown voltage and/or the punch-through between source and drain typically define the voltage of a particular technology. To meet the standard protocols' electrical specifications, interface circuits must work at high voltages (e.g. 5V, 3.3 V etc) with high reliability. One notable problem in interfacing low-voltage circuitry with high-voltage circuitry is that if the voltage applied to the low-voltage circuitry gets too high, some devices may experience temporary or even permanent damage. The gate-oxide stress causes threshold voltage to fluctuate because of tunneling effect—moreover, device lifetime deteriorate.

At the process level, the high-voltage tolerant transistors can be fabricated by increasing gate oxide and an extended drain scheme. These devices increase the fabrication cost because of extra masks required to make device level tune in the same CMOS baseline process. Another disadvantage is performance degradation.

FIG. 1 shows a schematic diagram of a conventional input buffer 100 with an input IN and output OUT, for 3.3 volt devices. VDDS=3.3 volt.

FIG. 2 is a schematic diagram of a 5V tolerant input buffer operating at 3.3V nominal voltage. VDDS=3.3 volt. All the devices are in 3.3V technology. IN is connected to the drain of MOSFET M1, which translates the input signal to a lower voltage at node 1 for safe operation of the buffer 200. When IN goes as high as 5V, node is clamped to (VDDS–$V_t$), so all the devices are safe. Because the substrate bias effect $V_t$ of transistor M1 is high, node 1 voltage is comparatively low. This may cause M2 to be in weak inversion or in strong sub-threshold region. So, the conventional input buffer 200 will consume DC power, which is more serious in 0.13 µm technology because $V_t$ is less, when signal on pad is high. Moreover, this structure cannot be used when device is of 2.5V and is operating at 3.3V.

FIG. 3 is another schematic of 5V tolerant input buffer 300 in 3.3V technology. VDDS=3.3 volt. MOSFET 2 and an NMOS are used to clamp high voltage at the input. To avoid turn ON of M2 (because of difference {VDDS–V2}>|VtM2|), a weak pull-up structure consisting of two series transistors 4 (PMOS) and 5 (NMOS) has been used. It will pull the node 120 to VDDS level provided node 110 is at (VDDS+Vt5). It happens only when IN starts rising above VDDS. When IN reaches VDDS+|Vt1|, transistor 1 turns on and node 110 is charged to a voltage equal to IN. When IN rises to 5V, node 110 also gets charged to 5V. Transistor 3 remains OFF because the gate and source voltages are at the same level. Transistor 5 turns-on strongly and node 120 is pulled to VDDS (3.3V nominal). When the voltage at IN reaches ground level, node 110 discharges to (VDDS+|Vt1|) volt only through transistor 1. Transistor 3 pulls node 110 to |Vt3| level so that transistor 5 (NMOS) is OFF.

The circuit in FIG. 3 cannot be used for 2.5V devices operating at 3.3V because the gates of 1 and 2 cannot be connected to VDDS (3.3 Volt) directly. Moreover, 5V cannot be directly applied to the gate of 2.5V devices because the gate-bulk voltage (Vgb) for NMOS (5) is significant (5.0V) to deteriorate the oxide.

The circuit in FIG. 4 is another 5V tolerant input buffer structure using 2.5V devices designed for 2.5V operation. VDDS=2.5 volt. This structure is able to tolerate input signal of 5V while operating safely. In normal mode LPN is connected to ground. Transistors M1 and M4 form a source follower structure where M4 acts as a resistor. Node 1 never exceeds VDDS level. M9 has been added to speed-up the buffer when IN makes transition from high to low, because the size of transistor M4 is less (to reduce the dc power consumption in normal mode). Transistors M6 and M7 have been used to provide buffering at the output. This structure also works perfectly without stressing any device. But the buffer cannot be used for low power and 3.3 Volt operations. In normal mode it consumes dc current and an extra mode control signal is required.

U.S. Pat. Nos. 5,952,848 and 6,236,236 are referred to for additional reference.

Since for standard protocols, the voltage levels (usually 3.3V and 5V) are fixed, an input buffer is required which can tolerate signal of 5V at the receiver input and can be implemented with low-voltage technology.

It is therefore desirable to have an input buffer circuit, which is capable of receiving a high voltage without experiencing degradation of gate oxide lifetime. It would further be desirable if such input buffer does not increase the process complexity and is implemented in the recent technology while working at higher supply voltage (e.g. 3.3 volt nominal).

SUMMARY OF THE INVENTION

According to an embodiment of the present invention, structures and methods for a low-power input buffer enables low-voltage circuitry to be interfaced and operated with relatively high-voltage circuitry while minimizing the voltage across the gate oxide of transistors used in the input buffer. According to an embodiment of the present invention a stress-free circuit is achieved with fewer number of transistors while at the same time achieving large hysteresis (for better noise immunity) and providing high speed and low power. Device reliability is also improved.

An embodiment of the present invention provides a high-voltage tolerant input buffer circuit which includes a first NMOS transistor having its source terminal connected to the input pin, its gate terminal connected to a first reference voltage and its drain terminal connected to a first output terminal; a second NMOS transistor having its gate terminal connected to the first reference voltage and its source terminal connected to the first output terminal, a first PMOS transistor having its gate terminal connected to the drain terminal of the second NMOS transistor, its drain terminal connected to a second reference voltage which is lower than the first reference voltage and its source terminal connected to a second output terminal; a second PMOS transistor having its drain terminal connected to the drain terminal of the second NMOS transistor, its source terminal connected to the second output terminal; and its gate terminal connected to a control voltage, and a third PMOS transistor having its drain terminal connected to the second output terminal, its source terminal connected to a supply voltage, and its gate terminal connected to the control voltage.

The first output terminal is connected to the gate terminal of the lowermost NMOS transistor while said second output terminal is connected to the gate terminal of the topmost PMOS transistor and the control terminal is connected to the output of a complementary cascode structure which includes a plurality of transistors connected in series to provide feedback in order to improve speed of response.

A second complementary cascode structure having its input terminals connected in parallel with the input terminals of the first complementary cascode structure provides the output signal at a reduced voltage level, to the internal circuit.

The PMOS and NMOS transistors are small-sized transistors to speed up transition and reduce power dissipation.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 8 shows internal node waveforms for low to high transition at IN;

FIG. 9 shows internal node waveforms for high to low transition at IN;

FIG. 10 shows delay plot for Schmitt-buffer at nominal case; and

FIG. 11 shows max frequency of operation vs load plot.

DETAILED DESCRIPTION

Two reference signals—one to protect PMOS and the other to protect NMOS—are used to avoid gate-oxide stress and $V_{ds}$ stress for oxide degradation and hot carrier effect respectively. Reference signals are necessary to be incorporated in the high-voltage designs with very short channel devices. So a single reference block can be used for the whole IO ring in the chip. Reference signals are shared among different IOs in the ring. For the sake of clear understanding of the new circuit, reference block has not been described.

In one embodiment (FIG. 6), the input buffer circuit includes an n-channel field effect transistor and a feedback circuitry to provide a safe voltage range for the input inverter. This feedback circuitry structure includes series transistors and two-reference signal and is responsive to the voltage applied at the output node. It is also responsible for pulling-up the voltage at the gate of p-channel MOS transistor in the input inverter for low power consumption and to provide a high impedance input. This circuit does not consume dc current under steady state.

In another embodiment (FIG. 5), the input buffer circuit includes a cascoded inverter. The cascading transistors are connected to the reference signals to avoid gate-oxide and junction stress while the inverter input is connected to the safe node, which receives the high-voltage pad signals after level translation. This structure speeds-up the circuit performance in terms of speed and hence reduces short-circuit current during transition.

The invention also includes the cascoded structure for the input inverter, which is similar to the second embodiment. The output of this inverter is fed to the low-voltage level-translator to provide a core level output signal.

The present invention is not dependent on the body effect of the field effect transistors. So it is not very sensitive to the process variations. Since very stable reference voltages have been used, a high-voltage supply can be input (max of 5 volt) and tolerated.

The input buffer of the present invention is particularly suitable to provide a level-shifted output voltage in response to a high-voltage input signal while working at a little higher voltage (3.3+/−10% in the present invention) while using the advantage of low-voltage technology (2.5 volt in the present invention).

A Schmitt version of the input buffer is also presented to receive a TTL level signal and translate it to the CMOS level signal. A 400 mV of hysteresis has been achieved in the worst case with a small modification in the main input buffer. Silicon result is also given for the hysteresis value.

Figure 1:
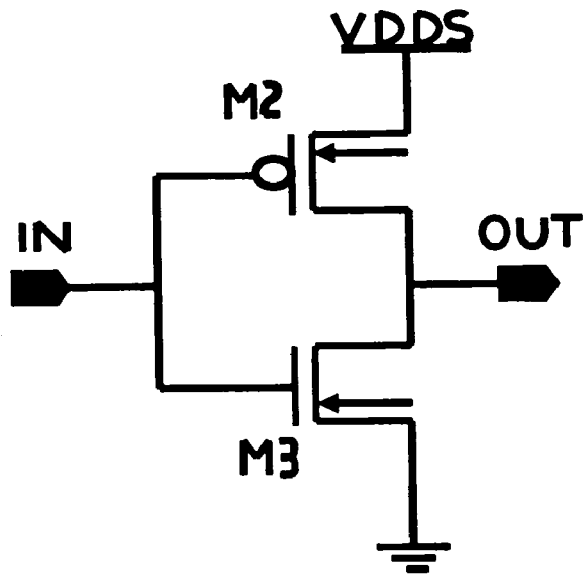
FIG. 1 is a schematic diagram of a conventional input buffer.
Figure 2:
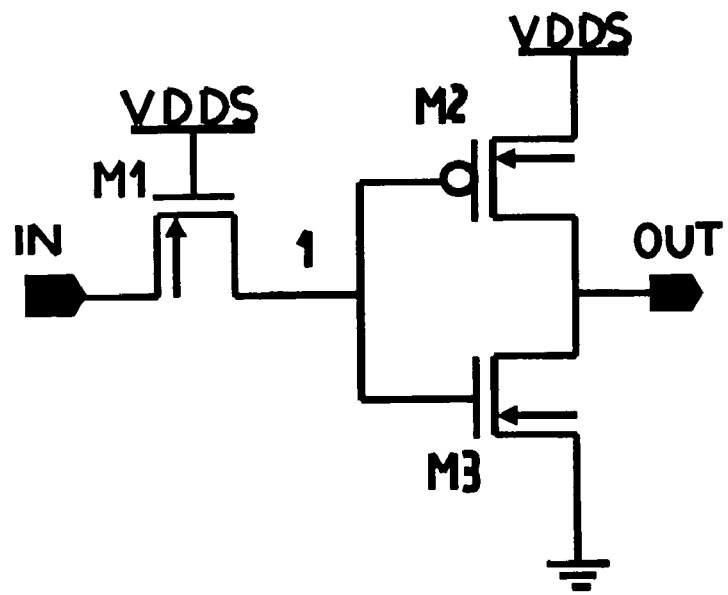
FIG. 2 is a schematic diagram of a conventional 5V tolerant input buffer.
Figure 3:
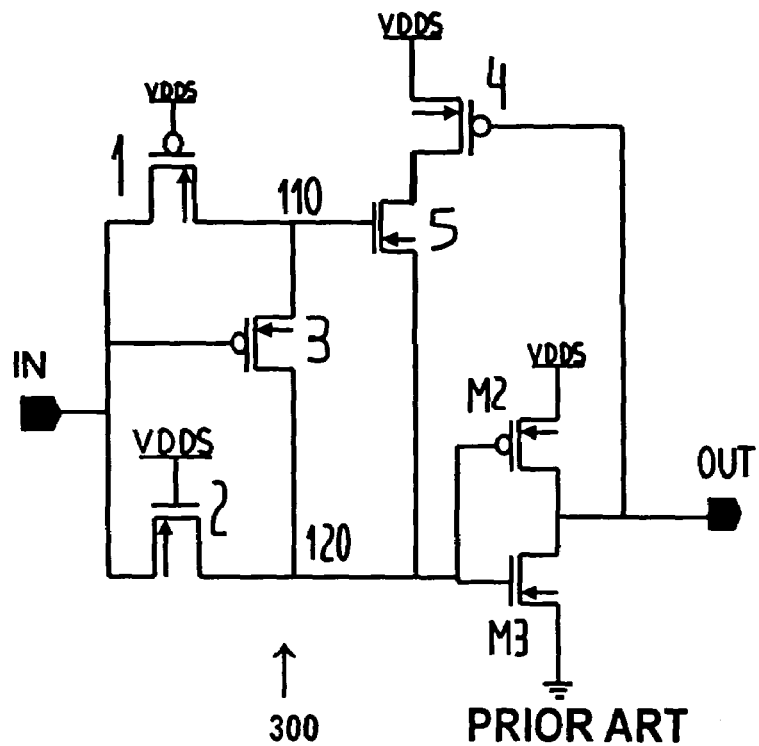
FIGS. 3-4 are schematic diagrams of similar 5V tolerant input buffer.
Figure 4:
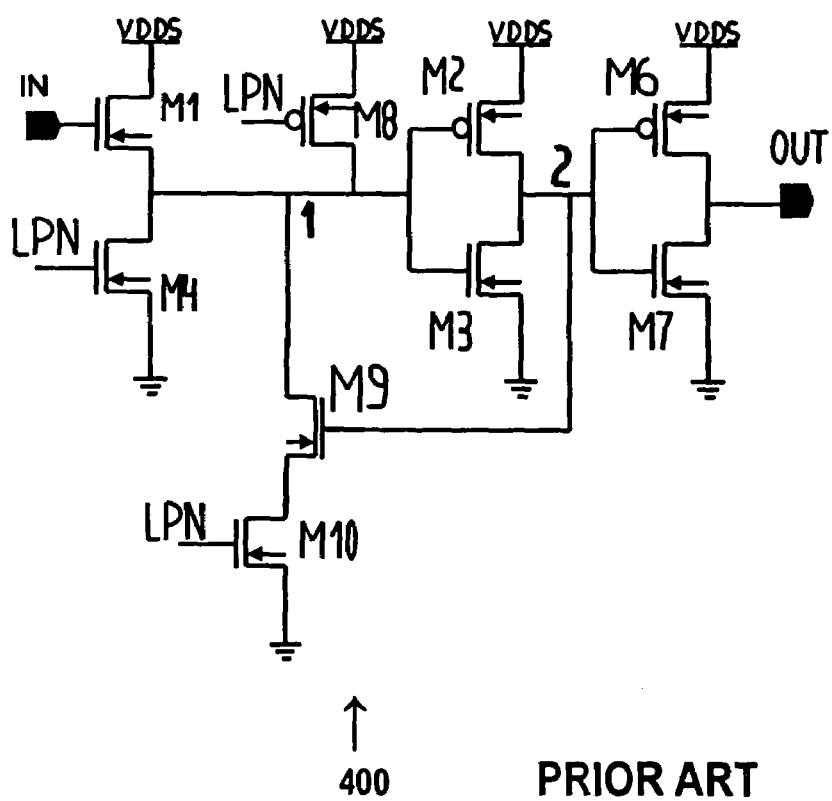
Figure 5:
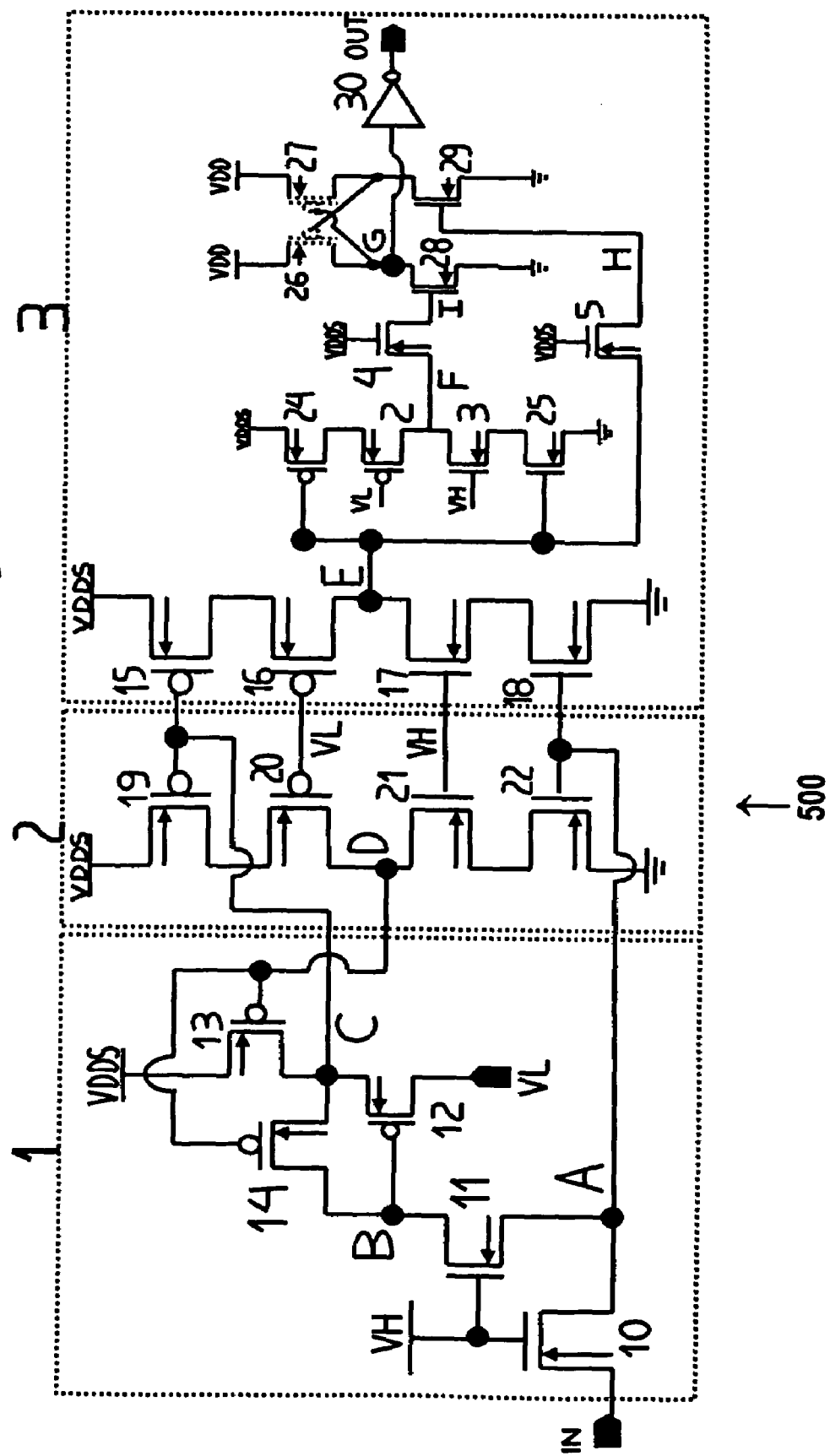
FIGS. 5-7 are schematic diagrams of 5V tolerant input buffer with low-voltage device according to the present invention (VDDS=3.3 volt)
Figure 6:
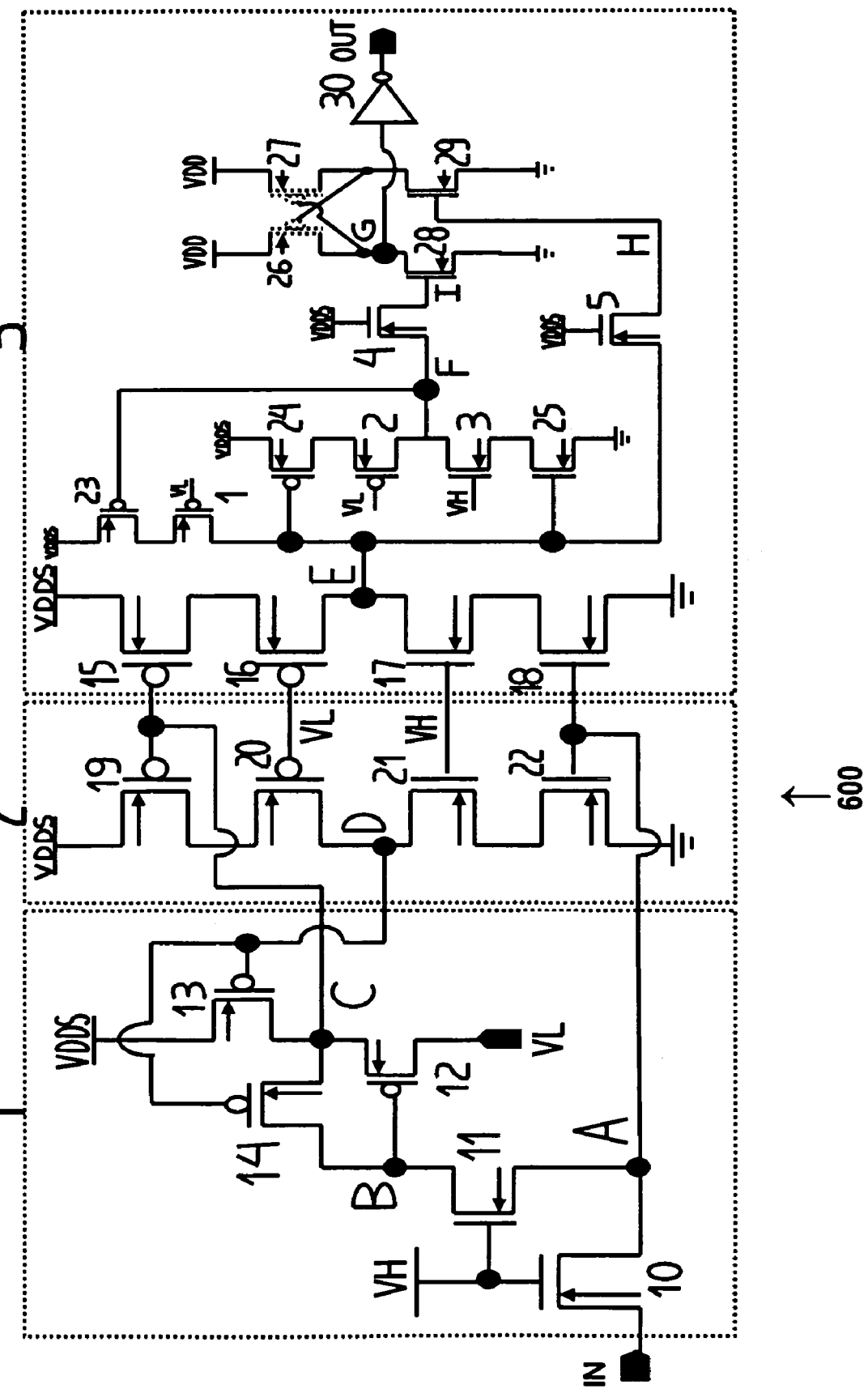

In this invention such an input buffer in 2.5V technology has been presented and described in detail below:

A schematic diagram for new circuit is shown below in FIGS. 5–6. FIG. 6 is an Schmitt version of new input buffer. It has been divided into three parts. Input block 3 is a normal Schmitt buffer with a level-shifter at the output, which converts 3.3-volt signal to the core level (1.2 V nominal) CMOS signal. Since an input buffer is normally used to drive core logic in the chip, level-shifter has been added to make it complete. Block 2 has been added to increase the speed of the Schmitt buffer (different threshold point for high and low transition of Schmitt buffer for input signal inherently makes it slow). Block 1 is responsible for the protection of input transistors in block 3 by level-shifting the input signal (which are propagated from pad).

Input buffer 3 consists of two parts, input inverter and a VDDS (nominal 3.3 volt) to VDD (core level with nominal voltage 1.2 volt) level-shifter. All the transistors are 2.5-volt capable in 0.13 μm technology except transistors 26, 27 and inverter 30 which are 1.2-volt capable in 0.13 μm technology. Input inverter has two PMOS transistors 15 and 16 in series and two NMOS transistors 17 and 18 in series. Input inverter output E will swing from 0 to 3.3 volt (up to 3.6 volt in worst case) because it is directly connected to 3.3-volt power supply.

Inverter formed by transistors 24 and 25 also provides buffering to the signal at E. E and F are complementary signals of same level (3.3 volt) and are inputs of level-shifter. E is connected to the gate of NMOS 29 through pass-gate 5 and F to the gate of NMOS 28 through pass-gate 4. The two complementary outputs of level-shifter are pull-down by NMOSs 28 and 29. Only one of these outputs G has been used to drive the output inverter 30 to provide final CMOS level output. Transistors 4 and 5 have been used to level-translate the signal at F and E respectively so that signal levels at the gate of transistors 28 and 29 are 0–(VDDS–Vt|4|). Transistors 26 and 27 are 1.2-volt 0.13 um PMOS. This structure is faster than the two-inverter structure (First inverter of 3.3 V and second inverter of 1.2 V in 0.13 um) used for level shifting. Since low-voltage transistors 26 and 27 are faster (because of smaller channel length) than 28 and 29, they can be made smaller. Again transistors size ratio of PMOS (15 or 16) to NMOS (17 or 18) will decide the input inverter's threshold point and hence the $V_{il}$ or $V_{ih}$ level. Size of transistors 23 and 18 is tuned to achieve $V_{ih}$ level for worst case (2.0 worst TTL level). $V_{il}$ level is set by the input inverters pull-up and pull-down ratio. An extra NMOS can also be used as feedback between nodes F and E (like PMOS transistor 23) to set $V_{il}$ level if necessary.

The gate of PMOS 16 is connected to VL reference signal and gate of NMOS 17 is connected to the VH reference signal. The typical value for VH and VL is 2.5 V and 0.7 V. When pull-down (NMOS structure of 17 and 18) is off and pull-up (PMOS structure of 15 and 16) is on, E will be at 3.3 volt for typical case. Because of cascading of 17 and 18, $V_{ds}$, (drain to source voltage) of these two transistors will be less than 2.5 volt and $V_{dg}$ (drain to gate voltage) of 17 is approximately 0.8 volt. In worst case it will be 1.1 volt when VDDS is 3.6 volt. When pull-down is on and pull-up is off, E is at 0 volt. Again transistors 15 and 16 are free from $V_{ds}$ stress. Gate to drain voltage of 16 is only 0.7 volt. In any case Vgb (gate to bulk voltage) of 16 and 17 are 2.6 volt and 2.5 volt respectively.

Figure 7:
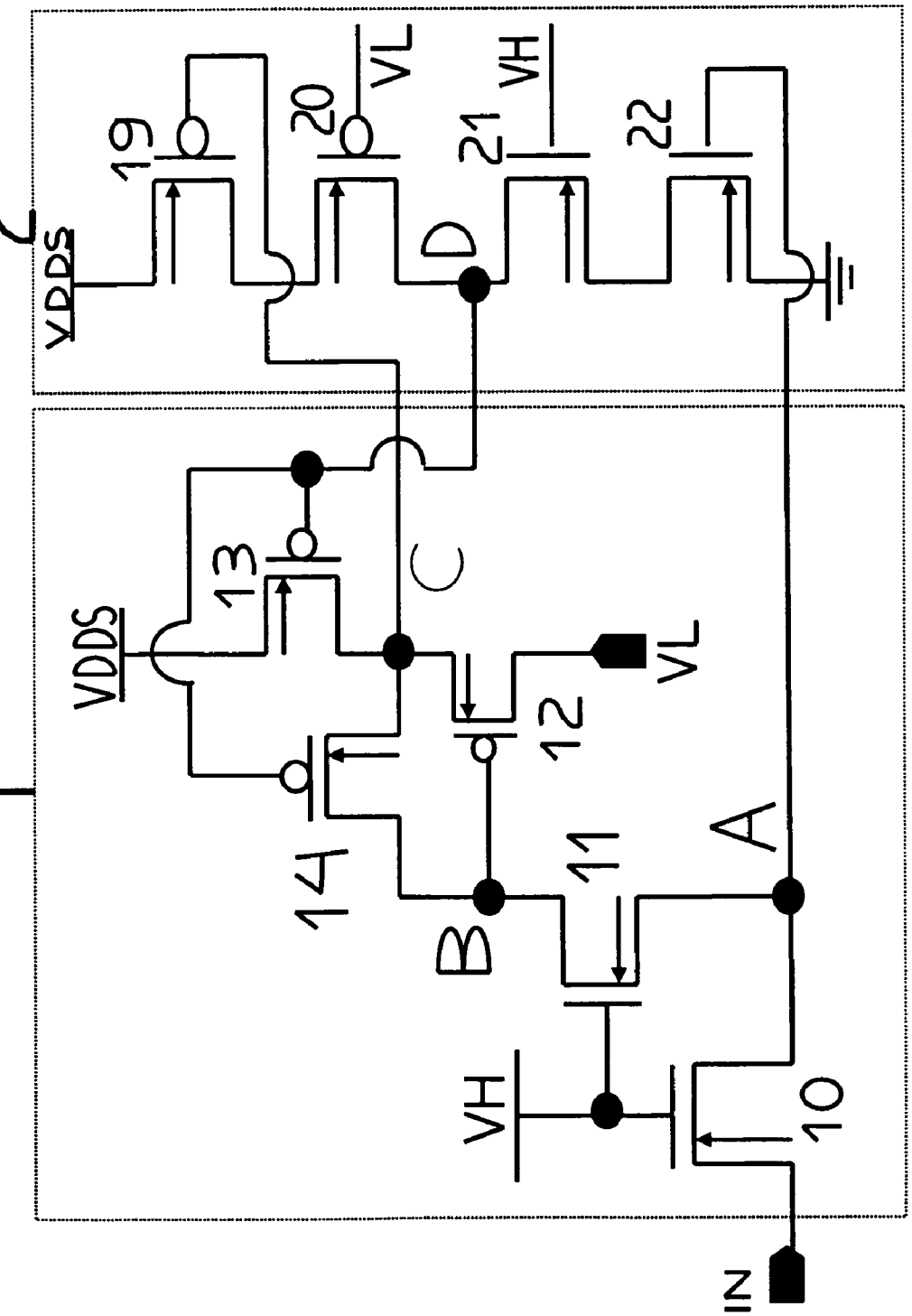

In fact, reference voltages VL and VH are dependent on supply voltage VDDS but the variation is small and it helps in making the junction and the gate-bulk voltages almost constant. For example, when VL is 0.7 volt for nominal case (3.3 volt), Vgb voltage for transistor 16 is 2.6 volt. When VDDS goes to 3.6 volt, VL increases to 0.8 volt to make Vgb 2.8 volt, which is acceptable for 2.5-volt device. Gate voltages of 15 and 18 are also limited by block 1 so that these devices are also safe from any kind of stress. For the sake of clarity, blocks 1 and 2 have been shown again in FIG. 7.

Block 1 has been added to level-translate the input signal. NMOS 10 is directly connected to the input with gate connected to VH (2.5 volt nominal). Level-translated signal A is the input of the block 2 and block 3 (Schmitt buffer). Max value for logic high at A will be (VH–vt10) which is less than VH so transistors 22 and 18 are also safe from stress. NMOS 11 is connected between nodes A and B with gate connection to VH. 11 will pass signal at A to B without level-translation. When logic high value at IN is 5.0 volts, $V_{dg}$ (drain to gate voltage) for 10 is approximately 2.5 volts and device 10 is not stressed. 10 and 11 will pass logic low (0 volt). When input IN is at logic high (3.0 to 5.0 volt, in case of TTL input worst value may be 2.0 volt), A and B will have values VH–vt10. It may be 2.0 volt if VH–vt10 is greater than 2.0 volt. PMOS 12 will turn-off immediately because node C is at VL when IN was at logic low. When node A and B rises to VH–vt10, NMOSs 22 and 18 turn on, pulling node D and E towards zero. PMOSs 19 and 15 are still ON because transistors 14 and 13 are OFF and C is at VL. As soon as D drops below (VDDS–|vt13|), 13 turns on and starts charging node C rapidly which turns-off PMOSs 19 and 15 which further increases the speed of pulling-down of node D and E (block 2). Transistors 19, 20, 21 and 22 are small sized transistors, which have been added to speed-up the transition. Since node E is being pulled-up by PMOS 23 (in block 3), it takes long time to go to logic low as compared to that at node D. So addition of these four small size transistors have made the turn-off of PMOSs 19 and 15 very fast and hence reduced the crowbar current during transition because of short transition period to make circuit efficient for power and speed. Transistor 14 is required to turn-off transistor 12 to stop steady current from VDDS to VL because 12 will turn-on when C will rise to VDDS. As soon as D falls below VDDS–|vt13|, C starts rising and when difference [V(C)–V (D)] crosses |vt14|, also turns-on and starts charging node B to VDDS. So device 14 will not let transistor 12 turn-on. Transistor 11 will not pass VDDS at B to A because NMOS 11 gate is connected to VH. This will not let the devices 22 and 18 to get stressed. The transition of these nodes has been shown in FIG. 8.

FIG. 8 shows internal node waveforms for low to high transition at IN. All the important internal nodes waveforms have been shown. Point C represents the point after which transition is very fast because of block 2. It is clear that node D makes transition much faster than node E. It is also clear that when A has made transition to VH–vt10, node C and hence node B makes full transition. If feedback point was E instead of D, it would have taken long time for the node E to make transition.

In the second case when the input makes transition from high to low, A and B will be low and NMOSs 22 and 18 will turn off immediately. Transistor 12 will start discharging node C. Since PMOS 14 is on initially, node C will be discharged through PMOS 14 also. As soon as C drops below VDDS–|vt19|, transistors 19 and 15 turns ON and node D gets charged to VDDS rapidly. This fast charging stops current from VDDS to VL by turning 13 OFF. Transistors 14 will also turn-off and node C will discharge only to VL. If somehow node C goes up or down to VL, it will be discharged or charged to VL again by 12 because gate of 12 is at logic low (0 volt). So the steady state value of C is VL and it will not cause stress to transistors 19 and 15. The internal nodes waveform has been shown in FIG. 9 for this case.

FIG. 9 shows internal node waveforms for high to low transition at IN. It is clear that transition of node E starts at point C. Block 1 introduces a small delay for high to low transition. This is the penalty, which will have to be paid for a stress free device operation higher voltage. After point C NMOS 22 turns-off and nodes A and B starts falling rapidly at the same time. Initially C starts falling fast because of two paths one through 14 and other through 12. When 14 turns off node C discharges through 12. Since transistor 12 is small (intentionally made) it delays the charging of node D and E. This is not a limitation of the design. If reference block has the capability to sink large current, then 12 can be made larger in size and speed can be improved further.

In this way block 1 protects the input transistors and along with block 2 it makes transition fast and reduces the crowbar current during transition.

Simulation Results:

Simulation results for the 5-volt tolerant Schmitt buffer in 0.13 um, 2.5 V CMOS process are provided below.

For performance, delay plot for the Schmitt buffer is shown in the FIG. 10. Data has been obtained for the nominal case and 3.3 V over temp range –40 to 125 degrees Celsius for 32× (32 times of the cap of 1× drive inverter) load.

In FIG. 11 maximum frequency of operation of Schmitt buffer has been plotted against load. Input clock has been assumed to have rise and fall time (measured from 0% to 100% of supply) as 20% of the total period and on/off period as 30% of the total period. This characteristic of clock is good enough to emulate the real data signal for maximum number of transitions for a given frequency. For the output to be considered as real waveform, it has been assumed that output must reach at-least 90% of VDDS for logic high and must be below 10% of VDDS for logic low.

FIG. 10 shows a delay plot for Schmitt-buffer at nominal case.

FIG. 11 shows maximum frequency of operation vs load plot. The Y-axis is maximum frequency in MHz and X-axis is load in pf.

Hysteresis Data Results from Silicon:

TABLE 1

Hysteresis data for the Schmitt

| LOT NO | VIL | VIH | VHYST |
|---|---|---|---|
| 1 | 1.084 | 1.516 | 0.432 |
| 2 | 1.05 | 1.47 | 0.42 |
| 3 | 1.089 | 1.526 | 0.437 |
| 4 | 1.083 | 1.518 | 0.435 |
| 5 | 1.06 | 1.46 | 0.40 |
| 6 | 1.097 | 1.523 | 0.432 |

The data given above in the table is for ambient temperature and 3.3 volt. The worst values obtained for VIL and VIH are 0.903 V and 1.693 V respectively (not shown in the table). So it is clear that even for different lots, VIL and VIH values are according to the TTL specification with enough margins.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A high-voltage tolerant input buffer circuit comprising:
a first NMOS transistor having a source terminal coupled to an input pin, a gate terminal coupled to a first reference voltage, and a drain terminal coupled to a first output terminal;
a second NMOS transistor having a gate terminal coupled to said first reference voltage and a source terminal coupled to said first output terminal;
a first PMOS transistor having a gate terminal coupled to a drain terminal of said second NMOS transistor, a drain terminal coupled to a second reference voltage lower than said first reference voltage and a source terminal coupled to a second output terminal;
a second PMOS transistor having a drain terminal coupled to the drain terminal of said second NMOS transistor, a source terminal coupled to said second output terminal; and a gate terminal coupled to a control voltage; and
a third PMOS transistor having a drain terminal coupled to said second output terminal, a source terminal coupled to a supply voltage, and a gate terminal coupled to said control voltage.

2. The high-voltage tolerant input buffer circuit of claim 1 further comprising a first complementary cascode structure.

3. The high-voltage tolerant input buffer circuit of claim 2 wherein said first complementary cascode structure comprises a plurality of series-coupled transistors to provide feedback and improve response speed.

4. The high-voltage tolerant input buffer circuit of claim 2 wherein said first output terminal is coupled to a gate terminal of a lowermost NMOS transistor in said first complementary cascode structure.

5. The high-voltage tolerant input buffer circuit of claim 2 wherein said second output terminal is coupled to a gate terminal of a topmost PMOS transistor in said first complementary cascode structure.

6. The high-voltage tolerant input buffer circuit of claim 2 wherein said control voltage is coupled to an output of the first complementary cascode structure.

7. The high-voltage tolerant input buffer circuit of claim 2 further comprising a second complementary cascode structure.

8. The high-voltage tolerant input buffer circuit of claim 7 wherein said second complementary cascode structure comprises input terminals coupled in parallel with input terminals of said first complementary cascode structure.

* * * * *